United States Patent [19]

Yamamoto

[11] Patent Number: 4,767,690

[45] Date of Patent: Aug. 30, 1988

[54] LIGHT-SENSITIVE MATERIAL CONTAINING SILVER HALIDE, REDUCING AGENT AND POLYMERIZABLE COMPOUND

[75] Inventor: Soichiro Yamamoto, Kanagawa, Japan

[73] Assignee: Fuji Photo Film Co., Ltd., Kanagawa, Japan

[21] Appl. No.: 70,860

[22] Filed: Jul. 8, 1987

[30] Foreign Application Priority Data

Jul. 8, 1986 [JP] Japan .................................. 61-160592

[51] Int. Cl.[4] .............................................. G03C 1/06
[52] U.S. Cl. ...................................... 430/138; 430/264; 430/270; 430/281
[58] Field of Search ............... 430/138, 255, 270, 281, 430/264

[56] References Cited

U.S. PATENT DOCUMENTS

4,629,676 12/1986 Hayakawa et al. ................ 430/199
4,649,098 3/1987 Takeda ............................... 430/264

FOREIGN PATENT DOCUMENTS

203613 3/1986 European Pat. Off. ............ 430/203

*Primary Examiner*—Richard L. Schilling
*Attorney, Agent, or Firm*—Sughrue, Mion, Zinn, Macpeak & Seas

[57] ABSTRACT

A light-sensitive material comprising a light-sensitive layer which contains silver halide grains, a reducing agent and a polymerizable compound provided on a support (the polymerizable compound is in the form of oil droplets which are dispersed in the light-sensitive layer and the oil droplets contain the silver halide grain), characterized in that the total amount of oil droplets containing at least five silver halide grains is not less than 50 weight % of the total amount of the oil droplets dispersed in the light-sensitive layer.

9 Claims, No Drawings

LIGHT-SENSITIVE MATERIAL CONTAINING SILVER HALIDE, REDUCING AGENT AND POLYMERIZABLE COMPOUND

BACKGROUND OF THE INVENTION

1. Field of the Invention

This invention relates to a light-sensitive material comprising a light-sensitive layer containing silver halide, a reducing agent and a polymerizable compound provided on a support.

2. Description of Prior Art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57-(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Further, Japanese Patent Provisional Publication No. 61(1986)-260241 describes another image-forming method in which the polymerizable compound within the area where a latent image of the silver halide has not been formed is polymerized. In this method, when the material is heated, the reducing agent functions as a polymerization inhibitor within the area where a latent image of the silver halide has been formed, and the polymerizable compound within the other area is polymerized.

Japanese Patent Provisional Publication No. 61(1986)-73145 (corresponding to U.S. Pat. No. 4,629,676 and European Patent Provisional Publication No. 0174634A2) describes an embodiment of the light-sensitive material, wherein said light-sensitive material contains a light-sensitive layer in which the polymerizable compound is dispersed in the form of oil droplets (including microcapsules prepared by forming a shell). The light-sensitive material having such a structure has an advantage of giving an image of high quality.

In the use of the light-sensitive material, it is preferred that the light-sensitive material is rapidly and stably developed on an area which has been exposed to light so as to give a clear image.

SUMMARY OF THE INVENTION

In order to accelerate the developing reaction within the exposed area, it may be first considered to increase the content of silver halide in the light-sensitive layer according to the knowledge in the conventional silver salt photography. On the contrary, according study of the present inventor, even if the content of silver halide in the light-sensitive layer is increased, the developing reaction is scarcely accelerated in the above-described image forming method. Further, it has been revealed that where a large amount of the silver halide (e.g., more than 0.2 g/m$^2$ in terms of the silver content) is contained in the light-sensitive layer, not a small amount of silver halide likely remains in the formed image and this remaining silver halide causes discoloration or staining in the image.

Accordingly, an object of the present invention is to provide a light-sensitive material which is rapidly and stably developed within an area having been exposed to light.

Another object of the invention is to provide a light-sensitive material which gives an improved clear image.

There is provided by the present invention a light-sensitive material comprising a light-sensitive layer which contains silver halide grains, a reducing agent and a polymerizable compound provided on a support, said polymerizable compound being in the form of oil droplets which are dispersed in the light-sensitive layer and said oil droplelts containing the silver halide grain, characterized in that the total amount of oil droplets containing at least five silver halide grains is not less than 50 weight % of the total amount of the oil droplets dispersed in the light-sensitive layer.

The present inventor has found that the progress of the developing reaction in the above-mentioned image forming method is less dependent on the amount of the silver halide contained in the light-sensitive layer, but suprisingly is mainly dependent on the number of the silver halide grains contained in individual oil droplets of the polymerizable compound. Further, it has been found that where the number of the silver halide grains contained in the oil droplet is five or more, the developing reaction within the exposed area is remarkably accelerated to give a clear and uniform image.

The above-described unexpected results can be explained below.

It is considered that not the whole surface but only a local surface of the silver halide grains (i.e., a local surface of the silver halide in the vicinity of the latent image core produced on the surface of the grain) participates in the developing reaction in the above-mentioned image-forming method. The sensitivity is affected by the grain size (diameter) of individual silver halide grains in the image-forming method in a similar manner to that in the conventional silver salt photography. However, the grain size of individual silver halide grains effects the development mechanism in the image-forming method much less than that in the conventional silver salt photography. Therefore, the rate of the developing reaction depends on the number of the silver halide grains rather than the whole amount of the silver halide.

In the system wherein the oil droplets are dispersed in the light-sensitive layer, the rate of the developing reaction depends on the number of silver halide grains contained in individual oil droplets each of which constitutes a picture element, and at least five silver halide grains are necessary for smooth progress of the developing reaction within the oil droplets. Therefore, the developing reaction within the exposed area is prominently accelerated in the case that five or more silver halide grains are contained in one oil droplet.

The reason why the developing reaction within the exposed area is remarkably accelerated as mentioned above is assumed that the silver halide grains have a certain distribution with respect to the sensitivity, even if they have an uniform grain size distribution, and the grains differ in the amount of light required for the developing reaction, as described in T. H. James, "The Theory of the Photographic Process", 4th edition, page 100. Accordingly, in order to allow the developing reaction to proceed rapidly and uniformly in the several oil droplets, it is required to increase the number of oil droplets containing at least certain number of silver halide grains therein. It is discovered by the present invention that the required number of silver halide grains in the oil droplet is five or more in an image forming method using the above-mentioned light-sensitive material.

In the light-sensitive material of the invention, the total amount of oil droplets containing five or more silver halide grains is not less than 50 weight % of the total amount of the oil droplets contained in the light-sensitive layer so that the developing reaction within the exposed area proceeds smoothly. As a result, the light-sensitive material can give an even and clear image.

DETAILED DESCRIPTION OF THE INVENTION

In the light-sensitive material of the invention, the light-sensitive layer contains oil droplets of a polymerizable compound wherein the total amount of oil droplets containing at least five silver halide grains is not less than 50 weight of the total amount of the oil droplets contained in the light-sensitive layer. The ratio of the oil droplets containing at least five silver halide grains can be adjusted by controlling the size of the silver halide grains, the amount of a silver halide emulsion and the size of the oil droplets containing the polymerizable compound in the process for preparation of the light-sensitive material.

The mean diameter of the oil droplets of the polymerizable compound (usually, not larger) than 20 $\mu$m) preferably is not less than 5 times as much as the mean grain size of the silver halide grains, more preferably is not less than 10 times. When the mean diameter of the oil droplets of the polymerizable compound is not less than 5 times as much as the grain size of the silver halide grains, the light-sensitive material of the invention can be easily prepared and an even and uniform image can be obtained in the image formation.

The number of the silver halide grains contained in the oil droplets can be calculated from the total amount of the silver halide contained in individual oil droplets and the grain size of the silver halide grains. The measurement is generally made on at least 100 oil droplets (preferably at least 200 oil droplets) contained in the light-sensitive layer.

The total amount of the silver halide contained in individual oil droplets can be measured using X-ray (or electron beam) microanalyzer. The X-ray microanalyzer is described in more detail in "X-ray Microanalyzer", third edition (published by Nikkan Kogyo Shinbunsha, Japan, 1978). An example wherein the X-ray microanalyzer is applied to the chemical analysis of silver halide grains, is described in Japanese Patent Provisional Publication No. 60(1985)-143332. The total amount of the silver halide contained in individual oil droplets can be easily determined using the X-ray microanalyzer according to this literature.

The silver halide, the reducing agent, the polymerizable compound, the support and the oil droplets containing the silver halide and the polymerizable compound which constitute the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-15432, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tabular grain having an aspect ratio of not less than 3 can be used.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m, and most preferably 0.05 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.2 g/m², more preferably in the range of from 1 mg to 90 mg/m².

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

In the light-sensitive material of the invention, the silver halide grains are contained in the oil droplets of the polymerizable compound which are dispersed in the light-sensitive layer. The reducing agent, the color image forming substance and the other optional component can be contained in the oil droplets or arranged outside of the oil droplets in the light-sensitive layer. Generally, the reducing agent is preferably contained in the oil droplets, because the reaction can progress smoothly in such case.

The oil droplets of the polymerizable compound are preferably in the form of microcapsules. There is no specific limitation on the microcapsules, and various known manners can be employed.

There is also no specific limitation on shell material of the microcapsule, and various known materials such as polymers used in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The silver halide grains are preferably arranged in the shell material of the microcapsules.

Further, two or more kinds of the microcapsules differing from each other with respect to at least one of the silver halide and the polymerizable compound can be employed. Furthermore, three or more kinds of the microcapsules differing from each other with respect to the color image formation substance is preferably employed to form a full color image.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area whre the latent image has not been formed in polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188536 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the abovementioned silver halide and an organic silver salt).

The light-sensitive material can be prepared by arranging a light-sensitive layer containing the abovementioned components on a support. There is no limitation with respect to the support. In the case that heat development is utilized in the use of the light-sensitive material, material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 $\mu$m is observed in not more than 20 positions among 100 positions which are determined at random on a filtered waviness curve obtained according to JIS-B-0610.

Various embodiments of the light-sensitive materials, optional components which may be contained in the light-sensitive layer, and auxiliary layers which may be optionally arranged on the light-sensitive materials are described below.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiators and solvents of the polymerizable compound.

There is no specific limitation with respect to other color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substance) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.) New Handbook of Pigments (in Japanese, 1977). These dyes and pigments can be used in the form of a solution or dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

In the case that the color image forming substance comprising two components (e.g., color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 20 parts by weight, and more preferably from 2 to 7 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonal dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxyalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substituents, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide grains and the reducing agent are preferably contained in the oil droplets containing the polymerizable compound and the base or base precursor is prefarably arranged outside of the oil droplets in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, or under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure pp. 26–28 (December 1976).

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles confaining no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. The size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensioned stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the oil droplets containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid compositions containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are add to the silver halide emulsion, the sensitizing dye is preferably added during the preparation of the emulsion. When the organic silver salts are introduced into the light-sensitive microcapsule, the emulsion of the organic silver salts can be prepared in the same manner as in the preparation of the silver halide emulsion.

In the preparation of the light-sensitive material, the polymerizable compounds are used as the medium for preparation of the liquid composition containing another component of the light-sensitive layer. For example, the silver halide, including the silver halide emulsion, the reducing agent, or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Further, optional components, such as the reducing agents, the color image forming substances may be dissolved, emulsified or dispersed in the light-sensitive composition. Furthermore, the necessary components for preparation of the microcapsule, such as shell wall-forming materials can be incorporated into in the light-sensitive composition.

The light-sensitive composition is preferably emulsified in an aqueous medium to prepare the light-sensitive material of the invention. In the case that the oil droplets containing the polymerizable compound are prepared in the form of microcapsules, the necessary components for preparation of the microcapsule, such as shell materials can be incorporated into the emulsion. Further, other components such as the reducing agent can be added to the emulsion.

The emulsion of the light-sensitive composition can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. 930,422; and the like. It is preferable, though not limitative, that the microcapsule is prepared by emulsifying core materials containing the polymerizable compound and forming a polymeric membrane (i.e., shell) over the core materials.

In the above-mentioned process, an aqueous dispersion of the polymerizable compound emulsion containing the silver halide grains (including an aqueous dispersion of the microcapsules) can be obtained. The light-sensitive material of the invention can be prepared by coating and drying the dispersion of the polymerizable compound on a supprot in the conventional manner.

Use of the light-sensitive material is described below.

In the use of the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized in the same manner as the light-sensitive material described in Japanese Patent Provisional Publication No. 61(1986)-260241.

A color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the light-sensitive material. In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the case that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. Further, the image-receiving layer can contain a white pigment such as titanium dioxide to function as a white reflection layer. Furthermore, a photo polymerization initiators or a thermal polymerization initiators can be contained in the image-receiving layer to polymerize the unpolymerizable polymerizable compound.

The thickness of the image-receiving layer preferably ranges from 1 to 100 μm.

A protective layer can be provided on the surface of the image-receiving layer.

After the development process of pressing the light-sensitive material in contact with the image-receiving material to transfer the polymerizable compounds which is still polymerizable to the image-receiving material, a polymer image can be obtained in the image-receiving material. The process for pressing can be carried out by various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

After the image was obtained, the image-receiving material can be heated. In the above-mentioned method, an improved image can be obtained by polymerizing the unpolymerizable polymerized compound which has been transferred on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Silver Halide Emulsion

In 1,000 ml of water were dissolved 10 g of gelatin and 0.5 g of sodium chloride, and the resulting gelatin solution was kept at 60° C. To the gelatin solution, 600 ml of an aqueous solution containing 70 g of potassium bromide and 600 ml of an aqueous solution containing 0.59 mole of silver nitrate were added simultaneously at the same feed rate over a period of 50 minutes. After 5 minutes, to the mixture was added 100 ml of aqueous solution containing 3.9 g of potassium iodide. Further, after 15 minutes, the mixture in the reaction vessel was cooled to form silver halide grains. Thus, a silver iodobromide emulsion having tetradecahedral grains, uniform grain size distribution and a mean grain size of 0.22 μm was obtained.

The emulsion was washed for desalting, and to the emulsion was added 90 ml of 0.5% of methanol solution of the following sensitizing dye to obtain the silver halide emulsion (A). The yield of the emulsion was 600 g.

(Sensitizing dye)

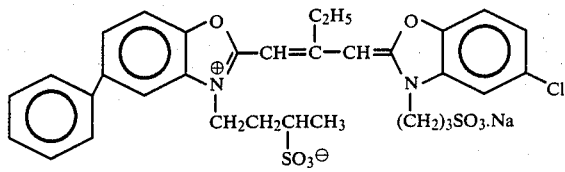

Preparation of Silver Benzotriazole Emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 6.50 to obtain a silver benzotriazole emulsion. The yield of the emulsion was 400 g.

Preparation of Light-Sensitive Composition

In 100 g of trimethylolpropane triacrylate were dissolved 0.1 g of the following copolymer, 12 g of following color image forming substance and 0.5 g of Emulex NP-8 (tradename of Nippon Emulsion Co., Ltd.).

(Copolymer)

-continued

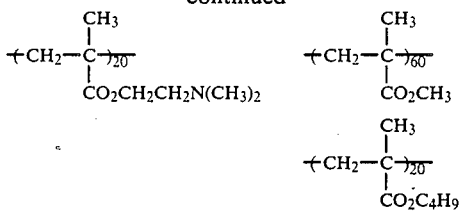

(Color image forming substance)

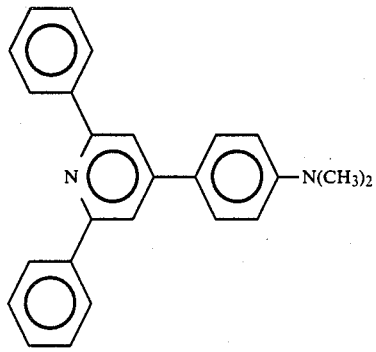

To 20 g of the resulting solution was added a solution in which 0.2 g of the following reducing agent (I) and 0.8 g of the following reducing agent (II) were dissolved in 2.0 g of methylene chloride.

(Reducing agent (I))

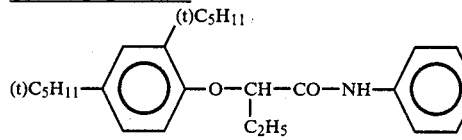

(Reducing agent (II))

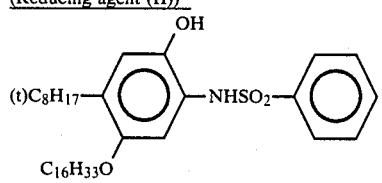

Further, to the resulting solution were added 1 g of the silver halide emulsion (A) and 0.3 g of the silver benzotriazole emulsion, and the mixture was stirred at 15,000 r.p.m. for 5 minutes to obtain a light-sensitive composition.

Preparation of Light-Sensitive Microcapsule

To 9 g of 20% aqueous solution of Isobam (tradename of Kuraray Co., Ltd.) was added 50 g of 2.5% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 70 g of the aqueous emulsion were added 8.0 g of 40% aqueous solution of urea, 3.0 g of 10% aqueous solution of resorcinol, 8.0 g of 37% aqueous solution of formaldehyde, and 3.0 g of 8% aqueous solution of ammonium sulfate in this order, and the mixture was heated at 60° C. for 2 hours while stirring. After the mixture was adjusted to a pH of 7.0 using 10% aqueous solution of sodium hydroxide, to the mixture was added 4.0 g of 30% aqueous solution of sodium hydrogen sulfite to obtain a dispersion containing light-sensitive microcapsules.

Preparation of Light-Sensitive Material

To 10 g of the light-sensitive microcapsule dispersion were added 1.0 g of 5% solution of the following anionic surfactant and 3.5 g of 10% solution (solvent-:water/ethanol=50/50 as volume ratio) of guanidine trichroloacetate to prepare a coating solution. The coating solution was coated on the polyethyleneterephthalate film (thickness: 100 μm) using a coating rod of #40 to give a layer having a thickness of 70 μm (50 g/m²) and dried at about 40° C. to obtain a light-sensitive material (I).

(Anionic surfactant)

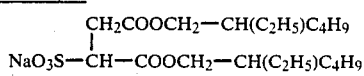

EXAMPLE 2

Preparation of Light-Sensitive Material

The light-sensitive material (II) was prepared in the same manner as in Example 1, except that the silver benzotriazole emulsion was not used.

COMPARISON EXAMPLE 1

Preparation of Light-Sensitive Material

The light-sensitive material (III) was prepared in the same manner as in Example 1, except that the amount of the copolymer used in the preparation of light-sensitive composition was altered from 0.1 g to 0.01 g.

COMPARISON EXAMPLE 2

Preparation of Light-Sensitive Material

The light-sensitive material (IV) was prepared in the same manner as in Example 1, except that the silver benzotriazole emulsion was not used.

COMPARISON EXAMPLE 3

Preparation of Light-Sensitive Material

The light-sensitive material (V) was prepared in the same manner as in Example 1, except that the stirring rate of the mixture of the light-sensitive composition in the preparation of light-sensitive microcapsule was altered from 7,000 r.p.m. to 15,000 r.p.m.

COMPARISON EXAMPLE 4

Preparation of Light-Sensitive Material

The light-sensitive material (VI) was prepared in the same manner as in Comparison Example 3, except that the silver benzotriazole emulsion was not used.

COMPARISON EXAMPLE 5

Preparation of Light-Sensitive Material

The light-sensitive material (VII) was prepared in the same manner as in Example 1, except that the amount of silver halide emulsion (A) used in the preparation of light-sensitive composition was altered from 1.0 g to 0.3 g.

COMPARISON EXAMPLE 6

Preparation of Light-Sensitive Material

The light-sensitive material (VIII) was prepared in the same manner as in Comparison Example 5, except that the silver benzotriazole emulsion was not used.

EXAMPLE 3

Preparation of Silver Halide Emulsion

The silver halide emulsion (B) was prepared in the same manner as in Example 1, except that the aqueous gelatin solution was kept at 40° C. in place of 60° C. The mean grain size of the silver halide emulsion (B) was 0.19 $\mu$m.

Preparation of Light-Sensitive Material

The light-sensitive material (IX) was prepared in the same manner as in Example 1, except that 1.0 g of the silver halide emulsion (B) was used in place of 1.0 g of silver halide emulsion (A).

EXAMPLE 4

Preparation of Light-Sensitive Material

The light-sensitive material (X) was prepared in the same manner as in Example 3, except that the amount of silver halide emulsion (B) used in the preparation of light-sensitive composition was altered from 1.0 g to 0.64 g.

EXAMPLE 5

Preparation of Silver Halide Emulsion

The silver halide emulsion (C) was prepared in the same manner as in Example 1, except that the aqueous gelatin solution was kept at 40° C. in place of 60° C., and to the gelatin solution were added 600 ml of the aqueous potassium bromide solution and 600 ml of the aqueous silver nitrate solution over a period of 20 minutes in place of 50 minutes. The mean grain size of the silver halide emulsion (C) was 0.15 $\mu$m.

Preparation of the Light-Sensitive Material

The light-sensitive material (XI) was prepared in the same manner as in Example 1, except that 1.0 g of the silver halide emulsion (C) was used in place of 1.0 g of the silver halide emulsion (A)

EXAMPLE 6

Preparation of Light-Sensitive Material

The light-sensitive material (XII) was prepared in the same manner as in Example 5, except that the amount of silver halide emulsion (C) used in the preparation of light-sensitive composition was altered from 1.0 g to 0.32 g.

Summary of the preparation of the light-sensitive materials (I) to (XII) is set forth in Table 1. In Table 1, "Silver Benzotriazole" indicates whether the silver benzotriazole emulsion was used (+) or not used (−), and "Stirring Rate" means the stirring rate of the mixture of the light-sensitive composition in the preparation of light-sensitive microcapsule.

TABLE 1

| Light-Sensitive Material | Silver Halide Emulsion | | Silver Benzo-triazole | Amount of Copolymer | Stirring Rate (r.p.m.) |
| --- | --- | --- | --- | --- | --- |
| | Kind | Amount | | | |
| (I) | (A) | 1.0 g | (+) | 0.1 g | 7,000 |
| (II) | (A) | 1.0 g | (−) | 0.1 g | 7,000 |
| (III) | (A) | 1.0 g | (+) | 0.01 g | 7,000 |
| (IV) | (A) | 1.0 g | (−) | 0.01 g | 7,000 |
| (V) | (A) | 1.0 g | (+) | 0.1 g | 15,000 |
| (VI) | (A) | 1.0 g | (−) | 0.1 g | 15,000 |
| (VII) | (A) | 0.3 g | (+) | 0.1 g | 7,000 |
| (VIII) | (A) | 0.3 g | (−) | 0.1 g | 7,000 |
| (IX) | (B) | 1.0 g | (+) | 0.1 g | 7,000 |
| (X) | (B) | 0.64 g | (+) | 0.1 g | 7,000 |
| (XI) | (C) | 1.0 g | (+) | 0.1 g | 7,000 |
| (XII) | (C) | 0.32 g | (+) | 0.1 g | 7,000 |

Each of the light-sensitive materials (I) to (XII) was respectively measured by using electron beam microanalyzer to obtain the amount of the silver halide contained in individual microcapsules. In the case that the silver benzotriazole is contained in the light-sensitive layer, the amount of the silver halide contained in individual microcapsules was obtained by modifying the above measured value with the quantity of halogen. The quantity of the halogen can be calculated from the halogen composition of the silver halide grains.

The number of the silver halide grains in individual microcapsules was calculated from the amount of the silver halide contained in individual microcapsules and the size of silver halide grains. As a result, the ratio (weight %) of microcapsules containing at least five silver halide grains were obtained. The results are set forth in Table 2. The measurement of these values was made on at least 200 microcapsules contained in each of the light-sensitive materials.

Preparation of Image-Receiving Material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomile dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on an art paper having a basis weight of 43 g/m² to give a layer having a wet thickness of 30 $\mu$m and dried to obtain an image-receiving material.

Evaluation of Light-Sensitive Material

Each of the light-sensitive materials (I) to (XII) prepared in Examples 1 & 2 and Comparison Example was imagewise exposed to light through a monochromatic transparency using a tungsten lamp at various quantity of light and then heated on a hot plate at 140° C. for 7 seconds. Each of the exposed and heated light-sensitive materials was then combined with the image-receiving material and passed through press rolls to obtain a magenta positive image on the image receiving material. The minimum density of the obtained image was measured. The results are set forth in Table 2. In Table 2, "Ratio of Microcapsule" means the ratio (weight %) of the microcapsules containing at least five silver halide grains, and "Amount of Silver Halide" means the total silver content of the silver halide grains contained in the light-sensitive layer.

TABLE 2

| Light-Sensitive Material | Ratio of Microcapsule ($\geqq 5$ AgX) | Amount of Silver Halide (mg/m$^2$) | Minimum Density of Image |
|---|---|---|---|
| (I) | 58% | 35 | 0.21 |
| (II) | 56% | 33 | 0.23 |
| (III) | 32% | 35 | 0.67 |
| (IV) | 33% | 33 | 0.55 |
| (V) | 45% | 35 | 0.49 |
| (VI) | 43% | 33 | 0.41 |
| (VII) | 18% | 12 | 0.94 |
| (VIII) | 17% | 10 | 0.82 |
| (IX) | 87% | 35 | 0.18 |
| (X) | 60% | 22 | 0.20 |
| (XI) | 96% | 35 | 0.17 |
| (XII) | 59% | 11 | 0.20 |

It is apparent from the result in Table 2, the light-sensitive materials (I), (II) and (IX) to (XII) gave a clear positive image having a low minimum density. It is also apparent that in order to accelerate the developing reaction to obtain an image having a low minimum density, the total amount of silver halide contained in the light-sensitive layer should not be increased, but the amount of the microcapsules (oil droplets of the polymerizable compound) containing at least five or more silver halide grains should be more than 50 weight %.

Further, in the obtained color image which each of the light-sensitive materials (X) and (XII) gave on the image-receiving material, no turbidity was observed after the image-receiving material had been preserved in the long term.

I claim:

1. A light-sensitive material comprising a light-sensitive layer which contains silver halide grains, a reducing agent and a polymerizable compound provided on a support, said polymerizable compound being in the form of oil droplets which are dispersed in the light-sensitive layer and said oil droplets containing the silver halide grain therein, wherein the total amount of oil droplets containing at least five silver halide grains is not less than 50 weight % of the total amount of the oil droplets dispersed in the light-sensitive layer.

2. The light-sensitive material as claimed in claim 1, wherein the total silver content of the silver halide grains in the light-sensitive layer is not more than 0.2 g/m$^2$.

3. The light-sensitive material as claimed in claim 1, wherein the silver halide grains have a mean grain size of 0.05 to 2 μm.

4. The light-sensitive material as claimed in claim 1, wherein the oil droplets have a mean diameter of not more than 20 μm.

5. The light-sensitive material as claimed in claim 1, wherein the mean diameter of the oil droplets is not less than 5 times as much as a mean grain size of the silver halide grains.

6. The light-sensitive material as claimed in claim 1, wherein the reducing agent is contained in the oil droplets.

7. The light-sensitive material as claimed in claim 1, wherein the light-sensitive layer contains a color image forming substance in the oil droplets.

8. The light-sensitive material as claimed in claim 1, wherein the light-sensitive layer contains an organic silver salt in the oil droplets.

9. The light-sensitive material as claimed in claim 1, wherein the oil droplets are in the form of microcapsules.

* * * * *